(12) United States Patent
Davies

(10) Patent No.: US 6,512,283 B2
(45) Date of Patent: *Jan. 28, 2003

(54) MONOLITHIC LOW DIELECTRIC CONSTANT PLATFORM FOR PASSIVE COMPONENTS AND METHOD

(76) Inventor: Robert Bruce Davies, 433 E. McKinley, Tempe, AZ (US) 85281

( * ) Notice: Subject to any disclaimer, the term of this patent is extended or adjusted under 35 U.S.C. 154(b) by 0 days.

This patent is subject to a terminal disclaimer.

(21) Appl. No.: 09/965,991

(22) Filed: Sep. 28, 2001

(65) Prior Publication Data

US 2002/0017698 A1 Feb. 14, 2002

Related U.S. Application Data

(63) Continuation of application No. 09/351,714, filed on Jul. 12, 1999, now Pat. No. 6,307,247.

(51) Int. Cl.$^7$ ............................................. H01L 29/00
(52) U.S. Cl. ..................... 257/522; 257/506; 257/528
(58) Field of Search ............................ 257/522, 506, 257/528, 501, 510, 511, 758; 438/214, 280, 319, 411, 461, 611

(56) References Cited

U.S. PATENT DOCUMENTS

| | | | | |
|---|---|---|---|---|
| 4,888,300 A | * | 12/1989 | Burton | 437/61 |
| 5,126,817 A | * | 6/1992 | Baba et al. | 357/49 |
| 5,308,786 A | * | 5/1994 | Lur et al. | 437/67 |
| 5,640,041 A | * | 6/1997 | Lur et al. | 257/510 |
| 5,753,961 A | * | 5/1998 | Tsuchiaki | 257/510 |
| 5,792,706 A | * | 8/1998 | Michael et al. | 438/626 |
| 5,869,880 A | * | 2/1999 | Grill et al. | 257/522 |

* cited by examiner

*Primary Examiner*—Tom Thomas
*Assistant Examiner*—Douglas W. Owens
(74) *Attorney, Agent, or Firm*—Parsons & Goltry; Robert A. Parsons; Michael W. Goltry

(57) ABSTRACT

A method for forming a low dielectric constant insulator in a monolithic substrate and the dielectric formed by the method. The method includes formation and patterning of a mask on a silicon substrate followed by anisotropic etching of the silicon to provide a dense array of deep holes. Isotropic etching may be used to form a cavity beneath the dense array of holes and coupling to bottoms of the holes. Sides of the holes are then thermally oxidized. A conventional dielectric is then formed, sealing tops of the holes. The conventional dielectric is optionally densified. Conventional chemical-mechanical polishing then planarizes the dielectric and further conventional processing may be carried out on the wafer to form active circuitry together with passive components such as high Q inductors.

18 Claims, 9 Drawing Sheets

MONOLITHIC LOW DIELECTRIC CONSTANT PLATFORM FOR PASSIVE COMPONENTS AND METHOD

This is a continuation of application Ser. No. 09/351,714, filed Jul. 12, 1999, now U.S. Pat. No. 6,307,247.

BACKGROUND OF THE INVENTION

1. Field of the Invention

This invention relates to a method of forming high quality factor passive components on silicon substrates.

More specifically, the present invention relates to formation of an etch mask on a silicon substrate and use of the etch mask to provide a low dielectric constant platform in the silicon substrate.

In a further and more specific aspect, the present invention relates to formation of a robust, high quality dielectric layer in a silicon substrate that is compatible with formation of active components to provide RF circuitry on the silicon substrate.

In another aspect, the present invention relates to formation of platforms suitable for carrying high speed digital busses.

2. Prior Art

In operation of RF integrated circuits, it is necessary to provide frequency-selective circuitry for filtering signals, amplifying selected signals with respect to other, unwanted signals and for other kinds of RF functions. As frequencies increase, the provision of frequency-selective components becomes more problematic, especially in monolithic form.

Various kinds of frequency selection components have been developed over the years. Some of these, such as crystals and SAWs, depend on mechanical resonances to provide frequency selectivity. These types of devices tend to be incompatible with silicon circuitry requirements for reasons having to do with materials engineering and also because these types of devices require different, and much more expensive, packaging than is typical for silicon circuitry.

As a result, much work has focused on attempts to provide LC frequency selection functions on silicon. However, especially the inductors tend to be difficult to form with high quality factor, also known as "Q". Additionally, the kinds of inductors that have been made tend to require large areas on the resulting integrated circuit. Some systems opt for separately-packaged frequency selection components, with the result that parts count is increased.

In an article entitled "Integrated Passive Components in MCM-Si Technology and their Applications in RF-Systems" by J. Hartung, 1998 Intl. Conf. on Multichip Modules and High Density Packaging, IEEE Cat. No. 0-7803-4850-8/98 (August '98), pp. 256–261, measured Qs and inductances for coils fabricated on silicon multichip modules are presented. In an article entitled "Applications for GaAs and Silicon Integrated Circuits in Next Generation Wireless Communication Systems" by L. M. Burns, IEEE JSSC, Vol. 30, No. 10, October 1996, pp.1088–1095, the demand for lightweight, portable communications products is addressed through monolithic integration of passive components in receivers and transmitters. These articles address system-level concerns that are met by combining separate circuits for the frequency selection functions.

Monolithic integration of inductors is also addressed in a variety of ways. For example, in an article entitled "Analysis, Design, and Optimization of Spiral Inductors and Transformers for Si RF IC's" by A. M. Niknejad and R. G. Meyer, IEEE JSSC Vol. 33, No. 10, October '98, pp. 1470–1481, design rules are discussed and performance tradeoffs are analyzed for spiral inductors.

In "A 1.8 GHz Low-Phase-Noise Spiral-LC CMOS VCO" by J. Craninckx and M. Steyaert, IEEE Cat. No. 0-7803-3339-X 96 (1996), pp. 30–31, silicon and GaAs technologies are discussed. Monolithic spiral inductors that are formed on conductive substrates tend to have reduced Qs due to losses that are caused by ground currents being induced in the substrate beneath the spiral inductors.

Unfortunately, while GaAs substrates may be made to be semi-insulating, thereby reducing or substantially eliminating parasitic substrate currents, GaAs substrates are expensive. Additionally, many GaAs devices have higher standby power requirements than do silicon devices.

Silicon substrates are typically provided with a lightly doped epitaxial layer for formation of active components (e.g., transistors and the like). A more heavily doped substrate is usually employed to support the epitaxial layer and to provide a low resistance ground return path for components formed in the epitaxial layer. Additionally, a highly doped substrate aids in prevention of latch-up phenomena.

While the heavily doped substrate provides a ground return path for the active circuits, it also results in reduced coil Q and losses when coils are formed on insulating layers above the substrate. As a result, silicon substrates that have been prepared for formation of active components are poorly suited to formation of high Q inductors.

One approach to providing monolithic inductors having increased Qs is to form a thick dielectric layer on the substrate. The inductors require a relatively thick dielectric layer in order to be adequately isolated from the conductive substrate. However, this results in a nonplanar surface, which interferes with photolithographic processes employed for definition of other circuit elements. Additionally, these dielectric layers tend to result in substantial stresses in the substrate, which can lead to bowing of the substrate and other problems.

It would be highly advantageous, therefore, to remedy the foregoing and other deficiencies inherent in the prior art.

Accordingly, it is an object of the present invention to provide improvements in masking for formation of high quality, thick dielectric layers in silicon substrates.

Another object of the present invention is the provision of an improved platform for formation of high speed digital busses on silicon substrates.

An additional object of the instant invention is the provision of an improved method and apparatus for providing thick dielectric layers on silicon substrates while preserving planarity of the substrate surface.

Moreover, an object of the instant invention is the provision of an improved method and apparatus for providing reduction in coil losses while preserving capability for formation of active components on a silicon substrate.

Still a further additional object of the present invention is to provide an improved process for forming passive components on silicon.

Still another object of the present invention is the provision of a method, system and apparatus for suppressing losses in coils that are monolithically cointegrated with other microelectronic components.

Yet still another object of the instant invention is the provision of a method for forming thick, planar, low dielectric constant, low loss dielectric layers in silicon substrates.

And a further object of the invention is to provide a method, system and apparatus for suppressing losses in monolithic inductors.

And still a further object of the invention is the provision of method and apparatus, according to the foregoing, which is intended to improve operation of inductors in monolithic silicon circuits.

SUMMARY OF THE INVENTION

Briefly stated, to achieve the desired objects of the instant invention in accordance with an aspect thereof, provided is a dielectric platform having a dielectric constant that is reduced below that of silicon dioxide and that is formed in a silicon substrate. The dielectric platform may be formed to have a depth of up to tens of microns. The dielectric platform may be coplanar or nearly coplanar with a surface of a silicon wafer, promoting subsequent formation of active circuitry using conventional techniques. As a result, high Q inductors may be realized together with conventional CMOS, bipolar or BiCMOS structures to form monolithic RF circuits.

BRIEF DESCRIPTION OF THE DRAWINGS

The foregoing and further and more specific objects and advantages of the instant invention will become readily apparent to those skilled in the art from the following detailed description of preferred embodiments thereof taken in conjunction with the drawings in which.

DETAILED DESCRIPTION OF THE PREFERRED EMBODIMENT

Figure 1:
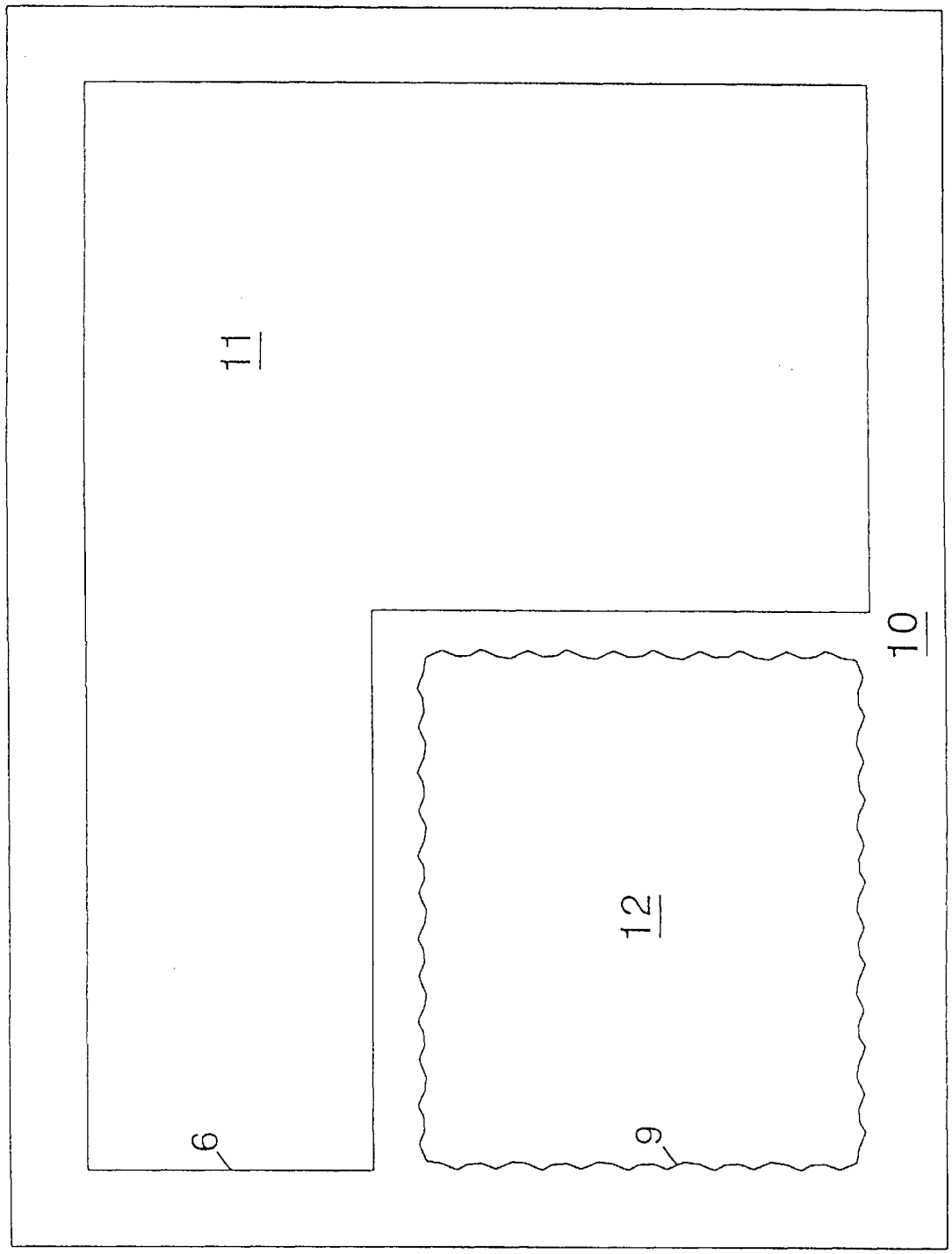
FIG. 1 is a simplified plan view of a portion of an integrated circuit including an etch mask formed on a silicon substrate, in accordance with an embodiment of the instant invention.

Turning now to the drawings, in which like reference characters indicate corresponding elements throughout the several views, attention is first directed to FIG. 1, which illustrates a simplified plan view of an embodiment of a dielectric platform, generally designated by the reference character 12, in accordance with an embodiment of the instant invention.

FIG. 1 is a simplified plan view of a portion of an integrated circuit showing dielectric platform 12 formed in a silicon substrate 10, in accordance with an embodiment of the instant invention. The substrate 10 includes one or more areas 11 that may be used to support active electrical components such as MOS and bipolar transistors, diodes, and the like. Active electronic components may be formed in the areas 11 using conventional CMOS, bipolar or BiCMOS processes. The dielectric platform 12 is outlined by a boundary 9 and the area 11 is outlined by a boundary 6. The dielectric platform 12 may be used to support passive electrical components such as interconnections, which may be formed from metals or doped polycrystalline silicon, for example.

The dielectric platform 12 may also be used to support inductors, such as spiral inductors, or thin film resistors, such as doped polycrystalline silicon or metal resistors. The platform 12 may also be used to support capacitors having two conductive plates separate by an insulating dielectric. The conductive plates may each be formed from metal, polycrystalline silicon or metal silicides. Examples include metal-insulator-metal, poly-insulator-metal, metal silicide-insulator-metal, poly-insulator-metal silicide or poly-insulator-poly capacitors.

An advantage provided by the dielectric platform 12 is that passive components formed on the dielectric platform 12 have greatly reduced capacitance to the conductive silicon substrate 10. As a result, reduced amounts of electrical power are required in order to switch electrical signals in conductors and other components formed on the dielectric platform 12, such as high speed digital busses and interconnects.

Increased electrical Qs and increased operating frequencies are possible for passive components formed on the dielectric platform 12, as is discussed in the Annual Report 1998 of the Instut Fur Halbleiter Physik (Prof. Abbas Ourmazed, IHP 15230, pp. 50–51). The approach described in this report provides improvements in coil Qs but also relies on long trenches that are subsequently oxidized to provide a thick dielectric having voids comprising only about 20% of the total volume of the dielectric. Further, these structures can result in substantial stresses being produced in the directions of the trenches.

It will be appreciated that while only one of the dielectric platforms 12 and areas 11 are shown in FIG. 1 for simplicity of illustration and ease of understanding, multiple examples of either may be formed on the substrate 10.

Figure 2:
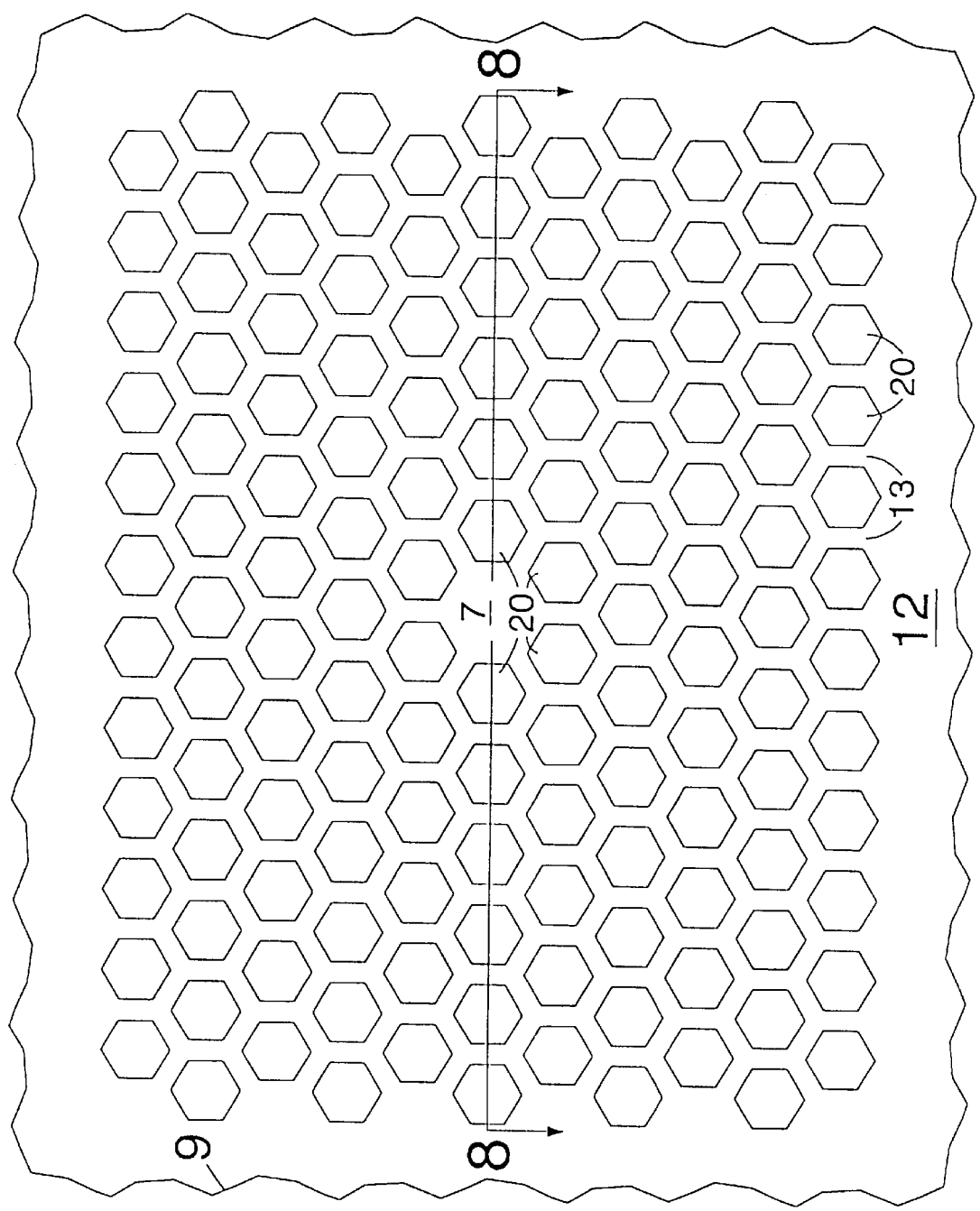
FIG. 2 is a simplified and enlarged plan view of a portion of the dielectric platform shown in FIG. 1, in accordance with an embodiment of the instant invention.

FIG. 2 is a simplified and enlarged plan view of a portion of the dielectric platform 12 shown in FIG. 1, in accordance with an embodiment of the instant invention. Within the boundary 9 of region 12, a mask 13 is formed that includes multiple openings 20. The openings 20 may have any shape, however, hexagonal openings 20 are shown in FIG. 2. In one embodiment, the mask 13 is formed by oxidizing a portion or all of the silicon substrate 10 followed by conventional photolithography and etching. One or more regions 7 may also be formed in portions of the mask 13.

In one embodiment, the openings 20 are formed to have a width, measured along section line 8—8, of between 0.5 and 2 microns. In one embodiment, the openings 20 are formed to have a width of about 1.2 microns and are separated by about 0.4 microns.

Figure 3:
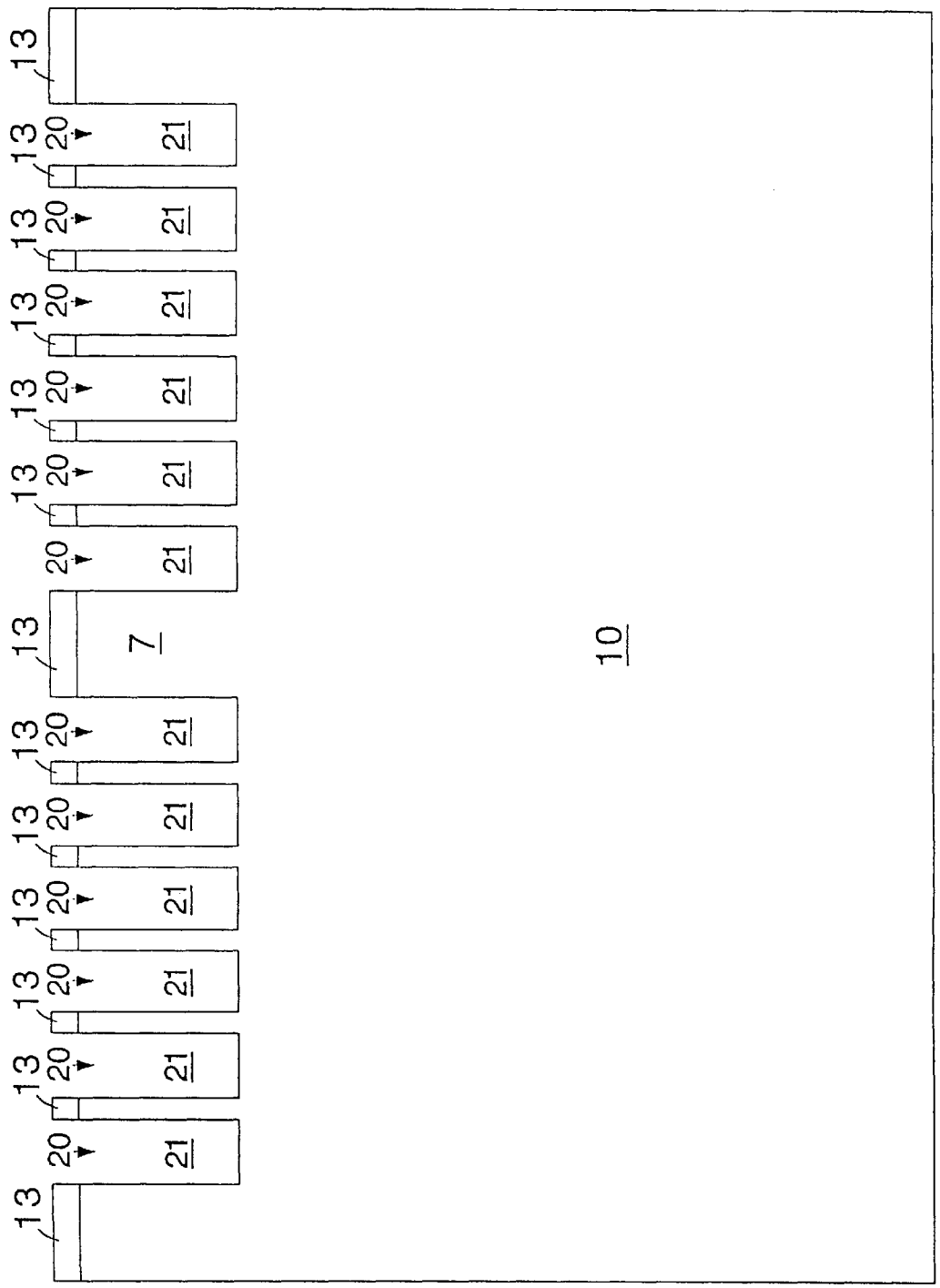
FIG. 3 is a simplified side view, in section, taken along section lines 8—8 of FIG. 2, of a silicon substrate at another step in processing, in accordance with an embodiment of the present invention.

FIG. 3 is a simplified side view, in section, taken along section lines 8—8 of FIG. 2, of a silicon substrate 10 at another step in processing, in accordance with an embodiment of the present invention. FIG. 3 illustrates a mask layer 13 having openings 20 and cavities 21 formed by etching the silicon substrate 10 through the mask 13. In one embodiment, the cavities 21 are formed by conventional anisotropic plasma etching of the silicon substrate 10 to have a depth of between 1 and ten microns. In one embodiment, the cavities are etched to have a depth of about three microns. In one embodiment, the etching is carried out using high speed anisotropic etching in a $HBr/NF_3/He$—$O_2$ plasma.

In one embodiment, the mask 13 is formed by conventional oxidation of portions of the substrate 10, followed by conventional photolithography and etching, such as anisotropic plasma etching. In one embodiment, the mask 13 is formed to have a thickness of between 0.3 and 1.0 microns. In one embodiment, the mask 13 is formed to have a thickness of about 0.6 microns.

Figure 4:
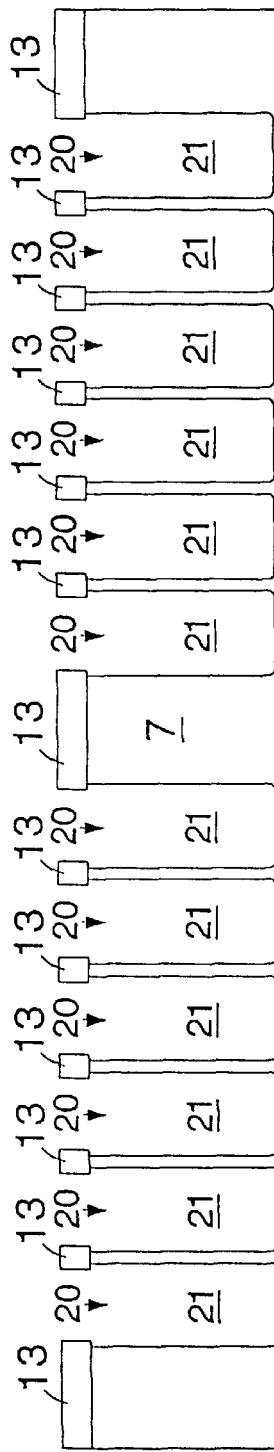
FIG. 4 is a simplified side view, in section, taken along section lines 8—8 of FIG. 2, of a silicon substrate at another step in processing, in accordance with an embodiment of the present invention.

FIG. 4 is a simplified side view, in section, taken along section lines 8—8 of FIG. 2, of a silicon substrate 10 at another step in processing, in accordance with an embodiment of the present invention. A conventional isotropic etch of the silicon substrate 10 has been employed to enlarge the cavities 21 and to reduce the thickness of the sidewalls separating the cavities 21. In one embodiment, the sidewalls are etched to have a thickness of about 0.2 microns. In one embodiment, the sidewalls are etched to have a thickness of between 0.1 and 0.4 microns.

Figure 5:
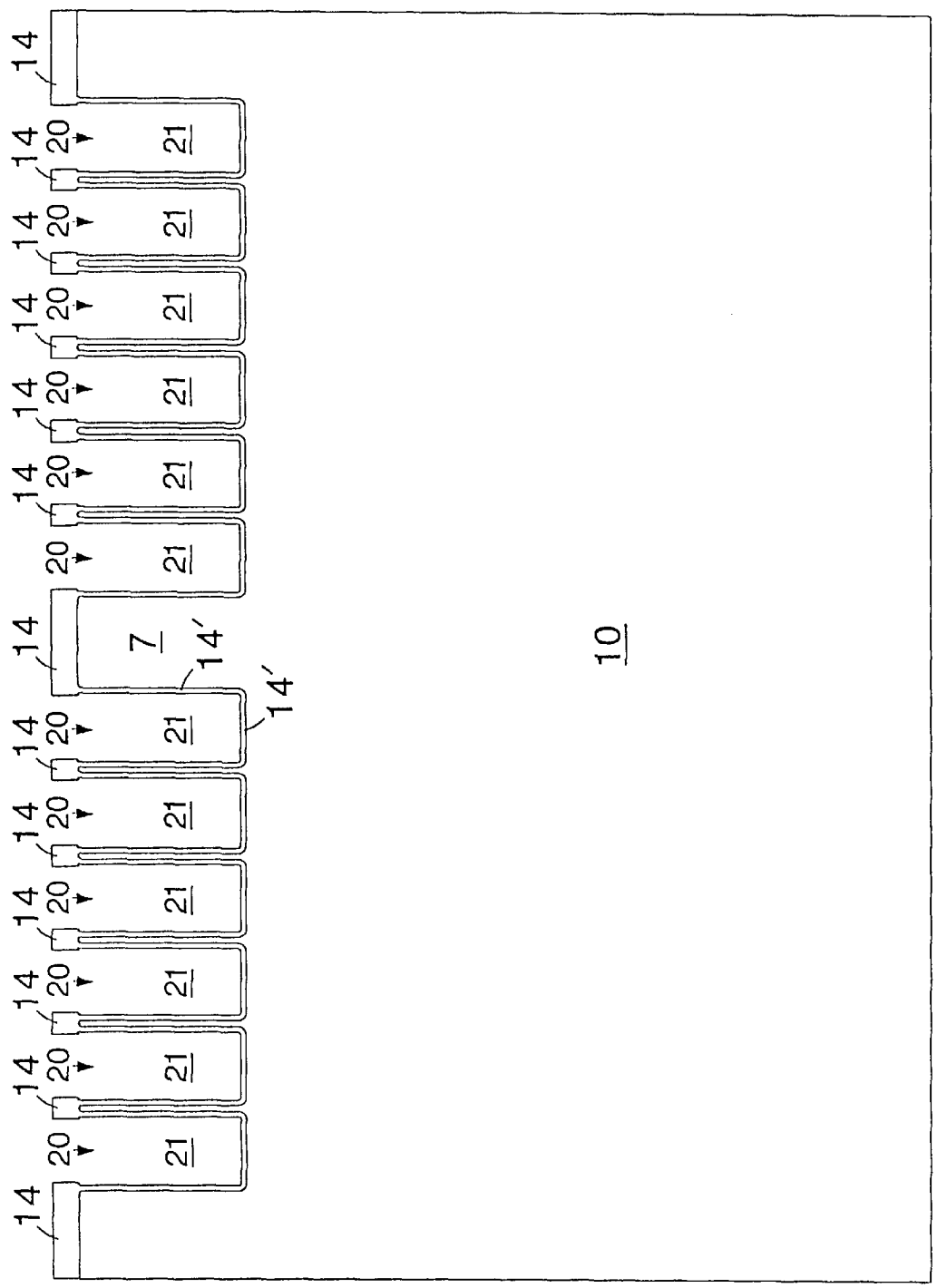
FIG. 5 is a simplified side view, in section, taken along section lines 8—8 of FIG. 2, of a silicon substrate at another step in processing, in accordance with an embodiment of the present invention.

FIG. 5 is a simplified side view, in section, taken along section lines 8—8 of FIG. 2, of a silicon substrate 10 at another step in processing, in accordance with an embodiment of the present invention. A conventional oxidation has been employed to oxidize all exposed silicon surfaces in the cavities 21, and the mask 13 has increased in thickness to form a mask 14. In one embodiment, the oxidation has been carried out to form an oxide layer 14. In one embodiment, the sidewalls have been oxidized to provide an oxide 14' having a thickness of between 0.01 and 0.2 microns. In one embodiment, the sidewalls have been oxidized to provide an oxide 14' having a thickness of about 0.1 micron.

Figure 6:
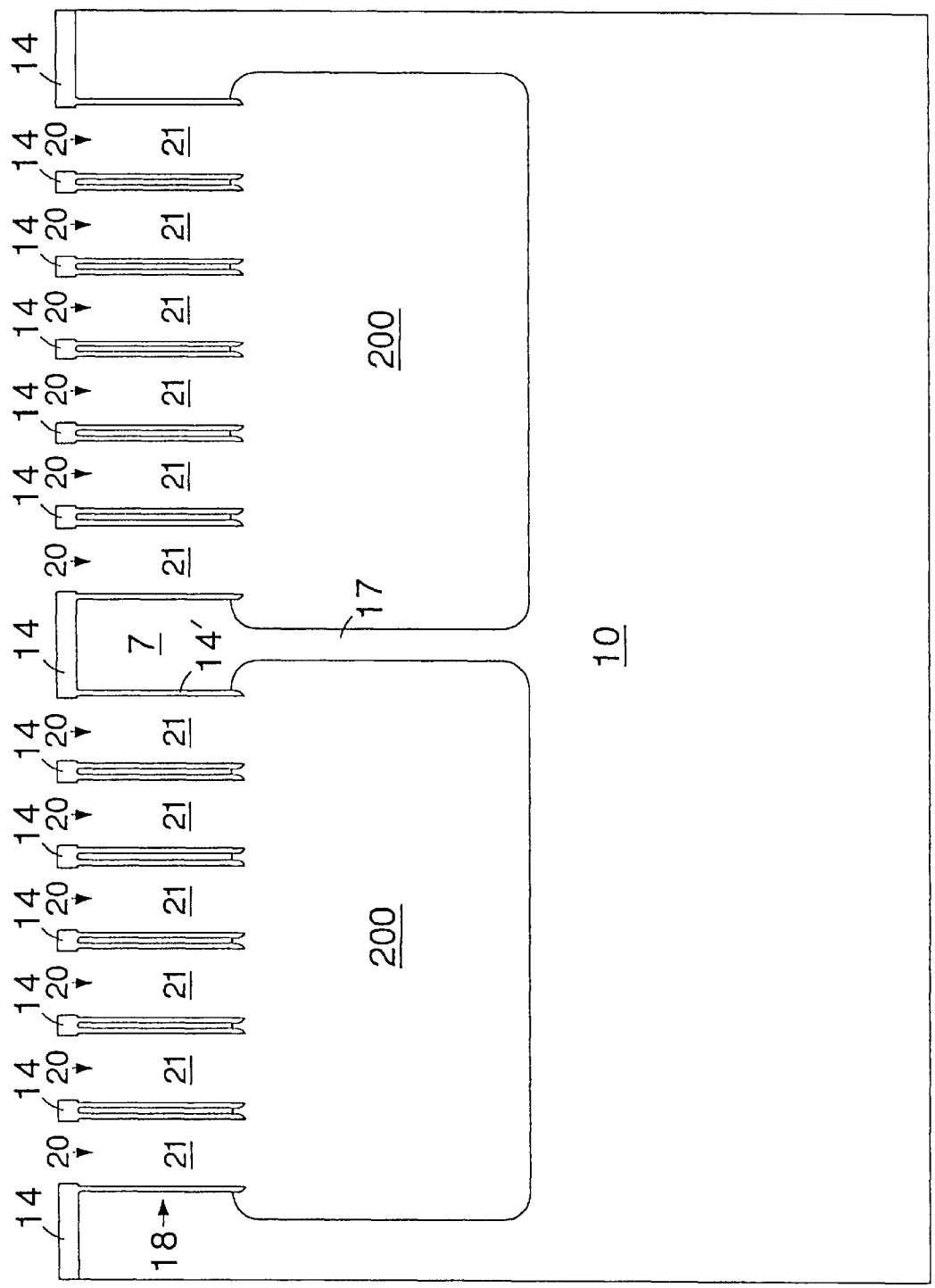
FIG. 6 is a simplified side view, in section, taken along section lines 8—8 of FIG. 2, of a silicon substrate at another step in processing, in accordance with an embodiment of the present invention.

FIG. 6 is a simplified side view, in section, taken along section lines 8—8 of FIG. 2, of a silicon substrate 10 at another step in processing, in accordance with an embodiment of the present invention. A conventional anisotropic plasma etch is used to remove the oxide layer 14' from bottoms of the cavities 21 but not from sidewalls of the cavities 21.

A conventional silicon etch is used to remove silicon from beneath the cavities 21 to provide one or more cavities 200. In one embodiment, the silicon etch is a high speed plasma etch having predominantly anisotropic characteristics. In one embodiment, alternating between isotropic etching and anisotropic etching completes the cavity 200. In one embodiment, one or more pillars 17 are formed within the cavity 200 beneath the region 7. In one embodiment, the cavity 200 is formed to have a depth of between 2 and 15 microns, and the increase in width is between 0.2 and 0.7 microns. In one embodiment, the cavity 200 is formed to have a depth of about 5 microns, and the increase in width is about 0.5 microns. As a result of these etches, a suspended lattice 15 comprised of silicon and a silicon based dielectric is formed above the cavity 200.

Figure 7:
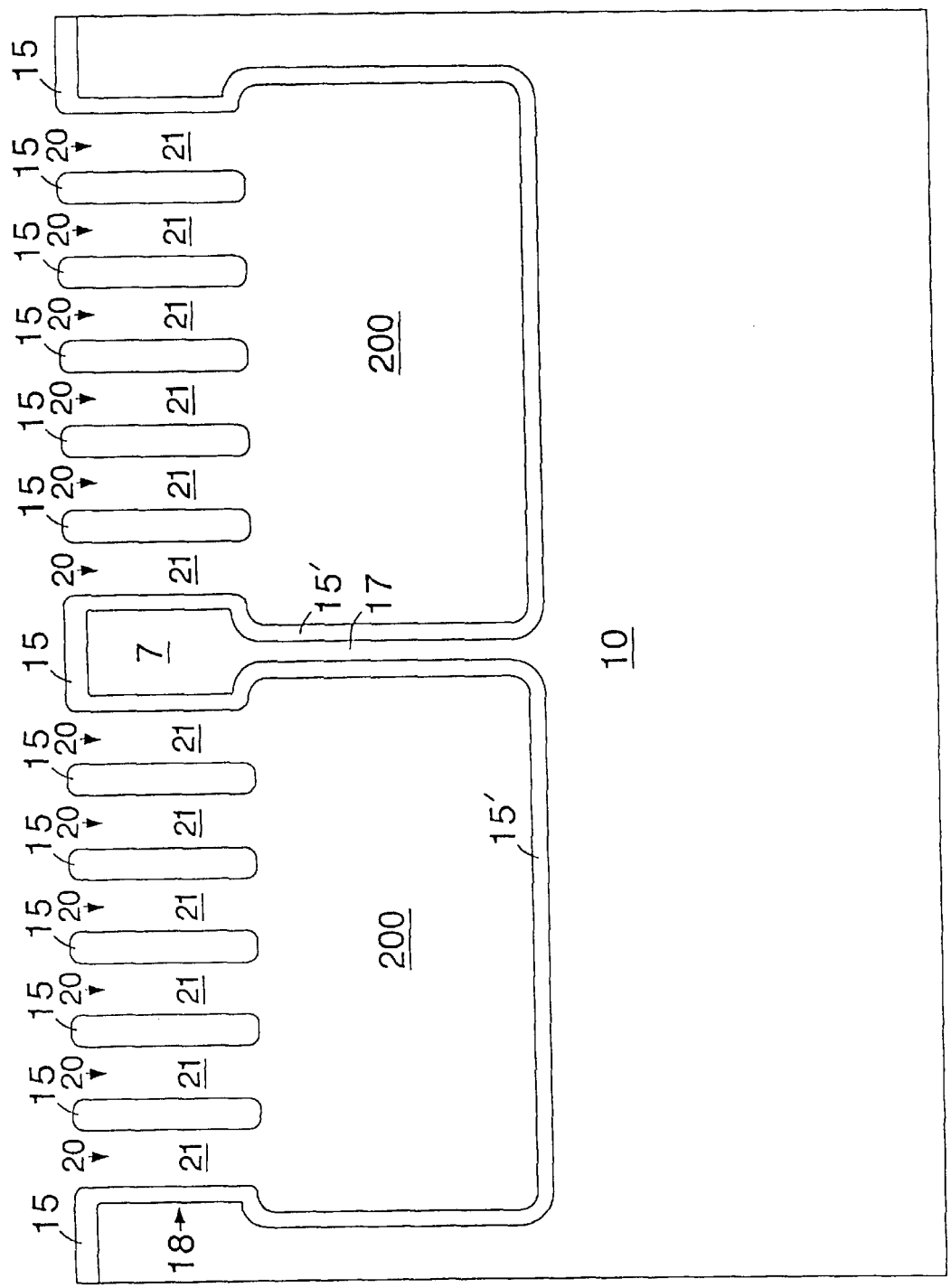
FIG. 7 is a simplified and enlarged side view, in section, taken along section lines 8—8 of FIG. 2, of a silicon substrate at another step in processing, in accordance with an embodiment of the instant invention.

FIG. 7 is a simplified and enlarged side view, in section, taken along section lines 8—8 of FIG. 2, of a silicon substrate 10 at another step in processing, in accordance with an embodiment of the instant invention. A conventional thermal oxidation has been used to provide a silicon dioxide layer 15' on all exposed silicon surfaces and to convert the suspended lattice 18 to silicon dioxide 15. As a result of the oxidation, the openings 20 have a reduced width. In one embodiment, the openings 20 have a width of about 1.16 microns and the silicon dioxide separating the openings 20 has a width of about 0.44 microns. In one embodiment, the oxide 15' has a thickness of about 0.22 microns. In one embodiment, the oxides 15 and 15' are conventional silicon oxynitride layers.

Figure 8:
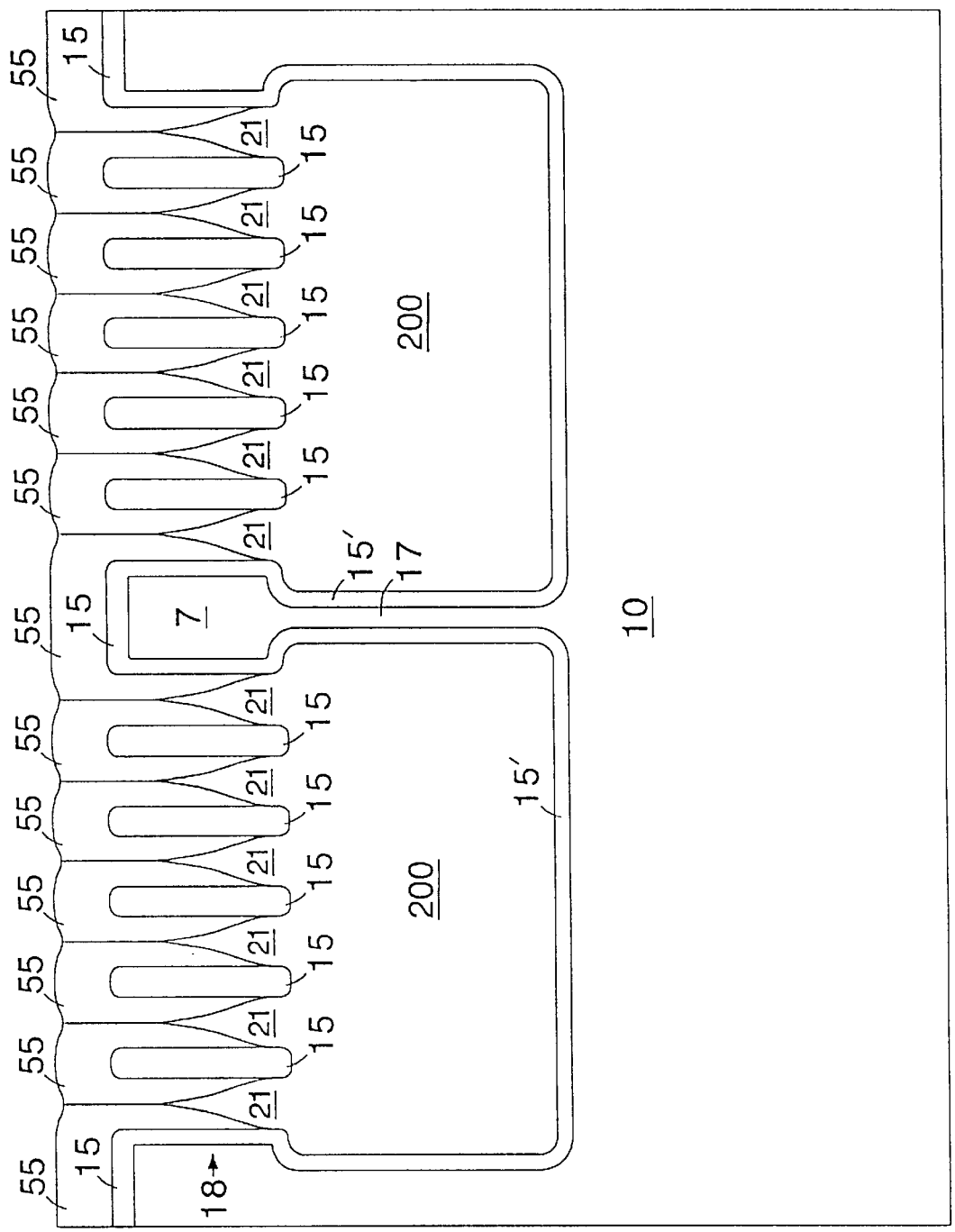
FIG. 8 is a simplified side view, in section, taken along section lines 8—8 of FIG. 2, of a silicon substrate at another step in processing, in accordance with an embodiment of the instant invention.

FIG. 8 is a simplified side view, in section, taken along section lines 8—8 of FIG. 2, of a silicon substrate 10 at another step in processing, in accordance with an embodiment of the instant invention. A layer 55 has been formed to fill all or most of the openings 20. The layer 55 may seal the openings 20 and isolate the cavity 200 from potential contamination. The layer 55 may be formed using CVD or gas deposition techniques.

In one embodiment, a conventional TEOS process may be used to deposit an oxide layer 55. It will be appreciated that formation of the layer 55 may result in some deposition of silicon dioxide within the cavity 200, however, significant improvements in relative dielectric constant and in parasitic capacitance to the substrate may still be provided. Conventional TEOS processes include heating of the substrate 10 in a partial vacuum, resulting in a partial vacuum or gaseous dielectric in the cavity 200 after the TEOS layer 55 seals the openings 20.

In one embodiment, the oxide layer 55 has been formed to a thickness of about 1.1 microns. The TEOS oxide layer 55 is formed and seals the cavity 200, resulting in a continuous oxide layer 55 at and slightly beneath the surface of the silicon substrate 10, filling tops of the cavities 21 and sealing them. In one embodiment, the cavity 200 includes a gaseous dielectric.

Figure 9:
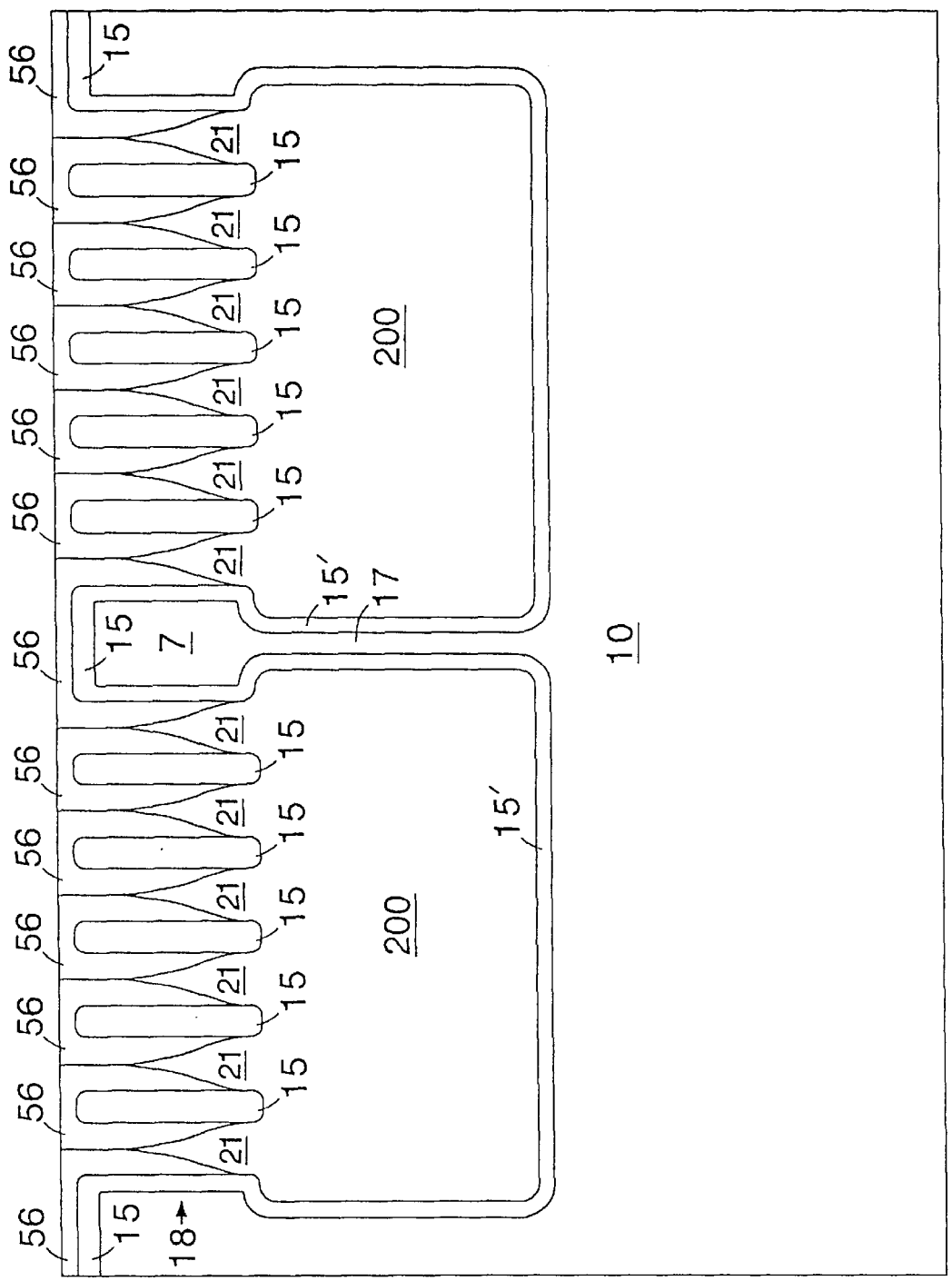
FIG. 9 is a simplified side view, in section, taken along section lines 8—8 of FIG. 2, of a silicon substrate at another step in processing, in accordance with an embodiment of the instant invention.

FIG. 9 is a simplified side view, in section, taken along section lines 8—8 of FIG. 2, of a silicon substrate 10 at another step in processing, in accordance with an embodiment of the instant invention. A conventional chemical-mechanical polish has been used to provide planarized regions 56 on the top surface of the silicon substrate 10 and to remove some or most of the TEOS oxide layer 55 from the regions 11 that will be employed in subsequent processing to provide active electronic components, as discussed above.

As a result, the planarized region 56 completes a dielectric platform that includes a cavity 200 in the conductive silicon substrate 10. The dielectric constant of the composite structure is greatly reduced compared to, e.g., what would be provided by a thick, predominantly solid dielectric layer. Additionally, reduced stress is induced in the silicon substrate 10 compared to thick dielectric layers or to dielectric layers prepared using etched trenches followed by oxidation, because the dielectric platform does not include long portions formed from oxide and does include substantial volumes that are not occupied by solids having thermal coefficients of expansion differing from that of the silicon substrate 10.

In one embodiment, the dielectric platform includes voids occupying in excess of 40% of the total volume prior to TEOS deposition. This results in an effective dielectric constant reduction of about 30%, from an $\epsilon_R$ of about 3.9 to an effective $\epsilon_R$ of about 2.74. In one embodiment, the dielectric platform includes voids occupying in excess of 50% of the total volume prior to TEOS deposition. This results in an effective dielectric constant reduction of about 39%, from an $\epsilon_R$ of about 3.9 to an effective $\epsilon_R$ of about 2.39. Formation of cavity 200 results in further reductions of the effective dielectric constant. In one embodiment, assuming a depth of about three microns for the silicon dioxide lattice 18 and a depth of about five microns for the cavity 200, an effective dielectric constant $\epsilon_R$ of about 1.81 is provided over a depth of about 8 microns. As a result, passive elements formed on top of the layer 56 of the dielectric platform 12 have sharply reduced parasitic capacitances to the substrate 10.

Traditional integrated circuits employ relative thin (e.g., less than one micron) dielectric layers for isolation of passive components and busses from the substrate. In comparison, the dielectric platform 12 of the present invention is capable of providing a substantially thicker dielectric. Additionally, the dielectric platform 12 may be formed to have a reduced dielectric constant relative to conventional dielectric layers. As a result, the effective dielectric constant of the dielectric platform 12 is reduced by both the reduced effective dielectric constant and the increased thickness. In one embodiment, the effective dielectric constant for capacitance between passive components formed on the surface 56 of the dielectric platform 12 and the substrate 10 is reduced by a factor of between one and two orders of magnitude over that of conventional dielectric layers. As a result, parasitic capacitance to the substrate is greatly reduced and losses due to substrate resistance are also dramatically reduced. The amount of current needed to switch the electrical state of conductors formed on the dielectric platform 12 is also dramatically reduced, reducing power requirements for integrated circuits formed using the dielectric platform 12.

For example, conventional CMOS and bipolar integrated circuits may be formed in areas adjacent to the dielectric platform 12, and these circuits may be coupled to and employ passive components such as spiral inductors, microstrip transmission lines and the like that are formed on the planar surface of the dielectric platform 12. Separating the planar surface from the silicon substrate 10 allows higher Qs to be realized for these passive components.

The foregoing detailed description of the instant invention for the purposes of explanation have been particularly directed toward formation of a dielectric platform allowing high Q inductors to be formed on silicon wafers together with transistors and other microelectronic components.

It will be appreciated that the need for thick, monolithic dielectric films has been described along with methods for meeting that need. A novel low dielectric constant insulator has been described that finds application in RF integrated circuits and in formation of interconnections for high speed digital circuits. The dielectric platform 12 also provides a substantial reduction in noise induced in the substrate 10 and coupled from the substrate 10 to other components due to switching transients. It will be appreciated that improvements in processing techniques may enable formation of dielectric platforms having smaller dimensions and thicknesses than have been described herein without departing from the scope of the appended claims.

Various changes and modifications to the embodiment herein chosen for purposes of illustration will readily occur to those skilled in the art. For example, the depth of the openings in the silicon substrate may be chosen as may be desired for a specific application. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A silicon substrate including a dielectric platform comprising:
   a dielectric lattice including an array of holes having a depth that is greater than a width of the holes, sidewalls of the holes being formed from a thermally grown silicon based dielectric and having a thickness of less than one micron, the width of the holes being less than two microns;
   a seal formed at tops of the holes; and
   a silicon area adjacent the dielectric platform that is suitable for formation of active electronic circuitry.

2. The substrate of claim 1 wherein a top surface of the dielectric platform is substantially coplanar with a top surface of the silicon substrate.

3. The substrate of claim 1 wherein the seal is formed from silicon based dielectric.

4. The substrate of claim 1 wherein the seal is formed from silicon dioxide by a TEOS process and is planarized using chemical-mechanical polishing.

5. The substrate of claim 1 wherein each of the holes in the array is sealed and includes a gaseous dielectric.

6. The substrate of claim 1 wherein diameters of the holes are all less than one micron.

7. The substrate of claim 1 wherein each of the holes in the array has a depth in excess of five microns.

8. The substrate of claim 1, further comprising a cavity formed beneath the holes in the array and coupled to multiple holes in the array.

9. The substrate of claim 1, further comprising:
   a cavity formed beneath the holes in the array and coupled to multiple holes in the array; and
   one or more pillars extending from a bottom of the cavity to the dielectric lattice.

10. A dielectric platform formed in a silicon substrate by a method comprising:
    forming a mask on a top surface of the substrate;
    etching an array of holes in the substrate, the holes each having a depth that is greater than a width of the holes, the width of the holes being less than two microns;
    thermally oxidizing sidewalls of the holes to provide a dielectric lattice, sidewalls of the holes being formed from silicon dioxide and having a thickness of less than one micron;
    forming a seal at tops of the holes; and
    planarizing a top surface of the seal using a chemical-mechanical polish.

11. The dielectric platform of claim 10 wherein planarizing includes planarizing the top surface of the seal to be substantially coplanar with a top surface of the silicon substrate.

12. The dielectric platform of claim 10 wherein forming a mask further comprises:
    etching through the array of holes to form a cavity beneath the holes, the cavity including one or more pillars extending from a bottom of the cavity to the lattice; and
    wherein forming a seal includes sealing the cavity such that the cavity includes a gaseous dielectric.

13. The dielectric platform of claim 10 wherein etching an array of holes includes etching an array of holes resulting in a lattice having a gaseous content of greater than thirty five percent.

14. A structure for reducing coupling of a device to a semiconductor substrate comprising:
  a dielectric lattice formed in the semiconductor substrate having an upper surface substantially planar to a surface of the semiconductor substrate; and
  a subsurface cavity formed beneath the dielectric lattice wherein the device overlies the dielectric lattice and the subsurface cavity.

15. The structure of claim 14, wherein the subsurface cavity is coextensive with the dielectric lattice.

16. The structure of claim 14, further including a layer sealing the dielectric lattice.

17. The structure of claim 14, further including pillars formed within the subsurface cavity and supporting the dielectric lattice.

18. The structure of claim 14, wherein the dielectric lattice includes silicon dioxide.

* * * * *